(12) United States Patent
Usuda

(10) Patent No.: US 12,316,300 B2
(45) Date of Patent: May 27, 2025

(54) REAL-TIME CLOCK DEVICE

(71) Applicant: SEIKO EPSON CORPORATION, Tokyo (JP)

(72) Inventor: Toshiya Usuda, Ina (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/468,428

(22) Filed: Sep. 15, 2023

(65) Prior Publication Data

US 2024/0007080 A1    Jan. 4, 2024

Related U.S. Application Data

(63) Continuation of application No. 17/201,029, filed on Mar. 15, 2021, now Pat. No. 11,811,389.

(30) Foreign Application Priority Data

Mar. 16, 2020 (JP) ................. 2020-045034

(51) Int. Cl.
*H03H 9/13* (2006.01)
*G06F 1/08* (2006.01)
(Continued)

(52) U.S. Cl.
CPC .............. *H03H 9/13* (2013.01); *G06F 1/08* (2013.01); *G06F 1/14* (2013.01); *H03B 5/32* (2013.01); *H03H 9/17* (2013.01)

(58) Field of Classification Search
CPC .... H03H 9/13; H03H 9/17; G06F 1/08; G06F 1/14; H03B 5/32
See application file for complete search history.

(56) References Cited

U.S. PATENT DOCUMENTS 7,321,235 B2    1/2008 Krach
8,283,663 B2 *  10/2012 Kobayashi ......... G11C 29/1201
                                              257/695
(Continued)

FOREIGN PATENT DOCUMENTS

JP    H10-223829 A    8/1998
JP    2009-026169 A   2/2009
(Continued)

*Primary Examiner* — Lincoln D Donovan
*Assistant Examiner* — James G Yeaman
(74) *Attorney, Agent, or Firm* — Harness, Dickey & Pierce, P.L.C.

(57) ABSTRACT

A real-time clock device includes a package that houses a resonator, an oscillation circuit, a clocking circuit, and a functional circuit, and on which external terminals are formed. The external terminals include a high-potential power supply terminal coupled to a high-potential power supply, a low-potential power supply terminal coupled to a low-potential power supply, a clocking signal terminal used at least for controlling the clocking circuit, and a functional signal terminal used for controlling the functional circuit, the functional signal terminal is arranged outside the high-potential power supply terminal, the low-potential power supply terminal, and the clocking signal terminal in a direction in which the external terminals are arranged, and the real-time clock device further includes a switching circuit that switches between a state in which the functional signal terminal and the functional circuit are coupled and a state in which the functional signal terminal and the functional circuit are not coupled.

6 Claims, 3 Drawing Sheets

(51) Int. Cl.
    *G06F 1/14*     (2006.01)
    *H03B 5/32*     (2006.01)
    *H03H 9/17*     (2006.01)

(56) References Cited

U.S. PATENT DOCUMENTS

| | | | |
|---|---|---|---|
| 10,333,491 B2 * | 6/2019 | Isozaki | G01N 21/3581 |
| 2012/0210023 A1 | 8/2012 | Ozaki et al. | |
| 2015/0123740 A1 | 5/2015 | Itasaka et al. | |
| 2017/0134004 A1 | 5/2017 | Isozaki et al. | |

FOREIGN PATENT DOCUMENTS

| | | | |
|---|---|---|---|
| JP | 2009032142 A | * | 2/2009 |
| WO | WO-2017122417 A1 | * | 7/2017 |

* cited by examiner

REAL-TIME CLOCK DEVICE

The present application is a continuation of U.S. patent application Ser. No. 17/201,029 filed Mar. 15, 2021, which is based on, and claims priority from JP Application Serial Number 2020-045034, filed Mar. 16, 2020, the disclosures of which are hereby incorporated by reference herein in their entireties.

BACKGROUND

1. Technical Field

The present disclosure relates to a real-time clock device.

2. Related Art

In the related art, real-time clocks that generate clocking information by clocking circuits are known. The real-time clock is used for various purposes. For example, purposes such as an event recorder for recording clocking information when an event occurs and an interrupt output for outputting a signal according to a lapse of a specific period are known. JP-A-2009-26169 describes examples of the former, and JP-A-2009-32142 describes examples of the latter. Further, as described above, a configuration is known that real-time clocks and functions for various purposes are realized by circuits in one package.

In the configuration in which circuits having real-time clocks and other functions are realized by one package, generally, external terminals are provided in the package, and signals used in each circuit are input and output based on the external terminals. The package is mounted on a substrate by soldering the external terminals to the substrate. In such solder mounting, cracks may occur due to the stress acting on the solder. As a result, the real-time clock device may not be able to perform the required functions due to a coupling failure at the external terminals.

SUMMARY

A real-time clock device for solving the problems includes: a resonator; an oscillation circuit that oscillates the resonator; a clocking circuit that performs clocking based on a signal from the oscillation circuit and generates clocking information; a functional circuit that performs information processing based on the clocking information; and a package that houses the resonator, the oscillation circuit, the clocking circuit, and the functional circuit, and on which external terminals are formed. The external terminals include a high-potential power supply terminal coupled to a high-potential power supply, a low-potential power supply terminal coupled to a low-potential power supply, a clocking signal terminal used at least for controlling the clocking circuit, and a functional signal terminal used for controlling the functional circuit, the functional signal terminal is arranged outside the high-potential power supply terminal, the low-potential power supply terminal, and the clocking signal terminal in a direction in which the external terminals are arranged, and the real-time clock device further comprises a switching circuit that switches between a state in which the functional signal terminal and the functional circuit are coupled and a state in which the functional signal terminal and the functional circuit are not coupled.

DESCRIPTION OF EXEMPLARY EMBODIMENTS

Here, embodiments of the present disclosure will be described in the following order.
(1) Configuration of Real-Time Clock Device
(2) Other Embodiments

(1) Configuration of Real-Time Clock Device

Figure 1:
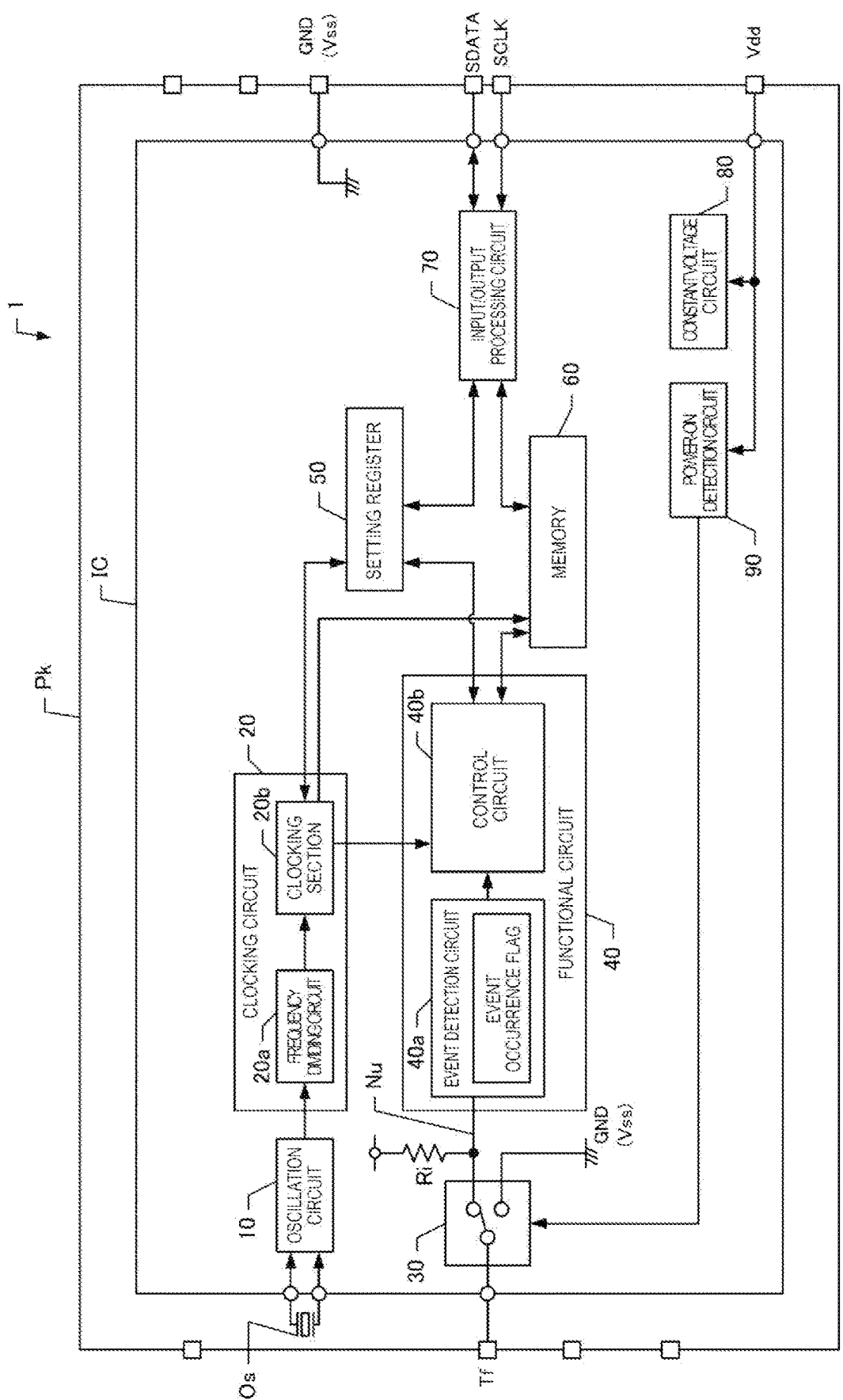
FIG. 1 is a configuration diagram of a real-time clock device according to an embodiment of the present disclosure.

FIG. 1 is a block diagram showing a configuration of a real-time clock device 1 according to a first embodiment. The real-time clock device 1 according to the present embodiment is a device in which a resonator Os and an integrated circuit (IC) are housed in a package Pk. In FIG. 1, external terminals are schematically shown by squares overlapped on rectangular sides indicating the package Pk. The external terminals are contacts provided on the package Pk and are soldered to a pad of a substrate.

Figure 2:
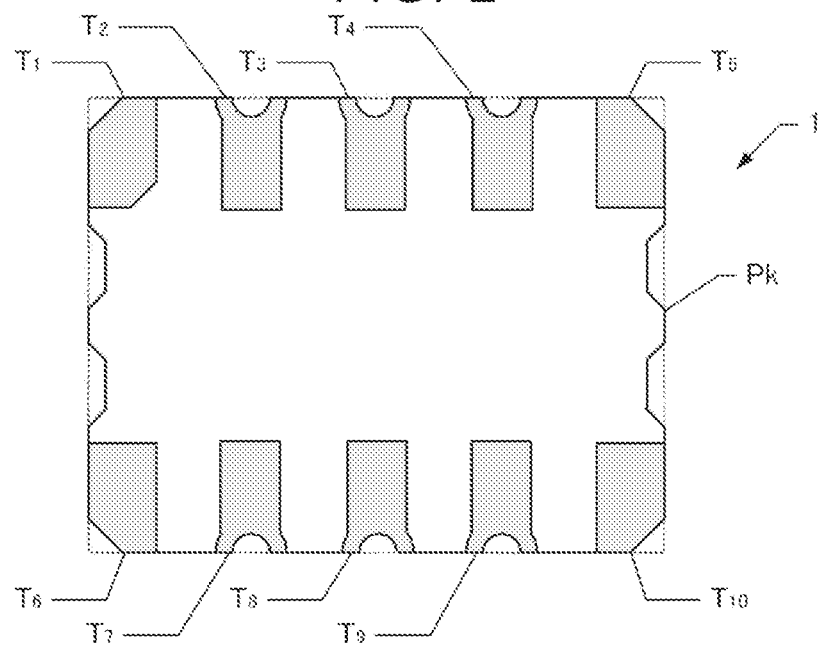
FIG. 2 is a diagram showing an arrangement example of external terminals.

FIG. 2 is a diagram showing a state in which the package Pk is viewed from the back side. The back surface is a surface facing the mounting surface of the substrate in a state of being mounted on the substrate. In FIG. 2, the external terminals are colored in gray. That is, the package Pk according to the present embodiment has a substantially rectangular parallelepiped appearance, and external terminals $T_1$ to $T_{10}$ are formed on the lower surface thereof.

In the present embodiment, when the shape of the back surface of the package Pk is considered to be a rectangle circumscribing the back surface, the external terminals are arranged side by side on two opposite sides of the rectangle, and five pieces are arranged along each side. In FIG. 2, a rectangle circumscribing the back surface is indicated by a broken line. In the external terminals $T_1$ to $T_{10}$ configured in this way, the external terminals $T_1$, $T_5$, $T_6$, and $T_{10}$ at the four corners are present outside the external terminals $T_2$, $T_3$, $T_4$, $T_7$, $T_8$, and $T_9$ other than these external terminals. In FIG. 1, the external terminals $T_1$, $T_5$, $T_6$, and $T_{10}$ at the four corners are schematically shown by squares overlapped on the left side of the package Pk. Further, the external terminals $T_2$, $T_3$, $T_4$, $T_7$, $T_8$, and $T_9$ present inside are schematically shown by squares overlapped on the right side of the package Pk.

The real-time clock device 1 according to the present embodiment has an event recorder function in addition to a clocking function. In order to realize these functions, the real-time clock device 1 includes an oscillation circuit 10, a clocking circuit 20, a switching circuit 30, a functional circuit 40, a setting register 50, a memory 60, an input/output processing circuit 70, a constant voltage circuit 80, and a power-on detection circuit 90.

The constant voltage circuit 80 generates a constant voltage supplied to each circuit based on a power supply voltage supplied from a high-potential power supply terminal Vdd shown in FIG. 1. The generated constant voltage is used for the operation of the oscillation circuit 10, the clocking circuit 20, the functional circuit 40, and the like. The high-potential power supply terminal Vdd is one of the external terminals of the package Pk. Further, the package Pk is also provided with a low-potential power supply terminal GND serving as a ground terminal as the external terminal. The low-potential power supply terminal may be a terminal to which a negative power supply potential is coupled.

The power-on detection circuit 90 is a circuit that detects whether or not a power has been turned on to the high-potential power supply terminal Vdd. That is, when a predetermined power supply voltage is applied to the high-potential power supply terminal Vdd, the power-on detection circuit 90 outputs a signal indicating that the power has been turned on to the switching circuit 30 after a predetermined time has elapsed. The lapse of a predetermined time may be specified by various methods. For example, the lapse of a predetermined time may be specified by a counter, or a signal output in response to power-on may be delayed for a predetermined time and output to the switching circuit 30, and various configurations can be employed.

The oscillation circuit 10 is a circuit that oscillates the resonator Os. That is, the resonator Os is coupled to the oscillation circuit 10, and when an electrical signal is inputted from the oscillation circuit 10, the resonator Os oscillates at a constant frequency. Then, the oscillation circuit 10 amplifies the signal of the resonator Os and outputs an oscillation signal, so that the signal having the same frequency as the frequency at which the resonator Os is oscillating is output as a source oscillation.

In the present embodiment, the resonator Os is a quartz crystal resonator using a quartz crystal as a substrate material, for example, an X cut tuning fork type quartz crystal resonator is used. The resonator Os may be an AT cut or SC cut quartz crystal resonator, or may be a surface acoustic wave (SAW) resonator or a micro electro mechanical systems (MEMS) resonator. Further, as the substrate material of the resonator Os, in addition to quartz crystal, a piezoelectric single crystal such as lithium tantalate and lithium niobate, a piezoelectric material such as piezoelectric ceramics such as lead zirconate titanate, or a silicon semiconductor material may be used. As the exciting means of the resonator Os, one by a piezoelectric effect may be used, or electrostatic drive by a Coulomb force may be used.

The clocking circuit 20 is coupled to the rear stage of the oscillation circuit 10. The clocking circuit 20 includes a frequency dividing circuit 20a and a clocking section 20b. The frequency dividing circuit 20a is a circuit that divides the source oscillation input from the oscillation circuit 10 and outputs a signal having a frequency of 1 [Hz]. The clocking section 20b generates clocking information indicating the current time based on the output of the frequency dividing circuit 20a. That is, the clocking section 20b counts the 1 [Hz] signal output from the frequency dividing circuit 20a, and clocks the year, month, day, day of the week, hour, minute, and second. Thereby, the clocking circuit 20 obtains the current time of year, month, day, day of the week, hour, minute, and second, and stores it therein as clocking information.

The switching circuit 30 is coupled to an external terminal Tf shown in FIG. 1, and can switch a coupling destination of the external terminal Tf. In the present embodiment, either a node Nu pulled up by a pull-up resistor Ri or a ground node is the coupling destination. In the present embodiment, the switching circuit 30 is controlled by the power-on detection circuit 90. That is, when a signal indicating that the power has been turned on is output from the power-on detection circuit 90, the switching circuit 30 couples the external terminal Tf to the node Nu. In this case, the functional circuit 40 coupled to the node Nu is in a state in which it operates in response to the signal input from the external terminal Tf. Therefore, in the present embodiment, the external terminal Tf is a functional signal terminal. The external terminal Tf, which is the functional signal terminal in the present embodiment, is used for controlling the functional circuit 40, but is not used for controlling the clocking circuit 20.

When a signal indicating that the power has been turned on is not output from the power-on detection circuit 90, the switching circuit 30 couples the external terminal Tf to the ground node. In this case, the functional circuit 40 coupled to the node Nu is in a state in which it does not operate in response to the signal to the external terminal Tf. As described above, the power-on detection circuit 90 outputs a signal indicating that the power is turned on from the power-on detection circuit 90 after a period of a predetermined time has elapsed from the start of power supply to the high-potential power supply terminal Vdd. Therefore, the power-on detection circuit 90 switches to the state in which the external terminal Tf (functional signal terminal) and the functional circuit 40 are not coupled during a period of a predetermined time from the start of power supply, and switches to the state in which the external terminal Tf and the functional circuit 40 are coupled after a lapse of the predetermined time.

According to the above configuration, it is possible to prevent an unexpected signal from being input from the external terminal Tf to the functional circuit 40 immediately after the power is turned on, which makes the operation of the real-time clock device 1 and various electronic devices coupled to the substrate unstable. Further, it is possible to prevent an unexpected signal from being output from the functional circuit 40 to the external terminal Tf.

The functional circuit 40 includes an event detection circuit 40a and a control circuit 40b. When a predetermined period elapses after the power is turned on, the event detection circuit 40a is coupled to the external terminal Tf of the real-time clock device 1 by switching the switching circuit 30. The event detection circuit 40a is configured to turn on an event occurrence flag (FlagEVENT) when the voltage level of the signal input to the external terminal Tf changes. Thereby, the event detection circuit 40a detects the occurrence of an event.

The control circuit 40b is coupled to the clocking section 20b and the rear stages of the event detection circuit 40a. Further, the control circuit 40b is coupled to the setting register 50 and the memory 60. Then, the control circuit 40b performs various processes such as reading data from the event detection circuit 40a and the clocking section 20b, and writing clocking information indicating the time when the event occurrence has been detected (event information) to the memory 60. A writing address of the clocking information may be predetermined or may be able to be specified.

The memory 60 is a storage medium for storing information, and includes an event memory area and a general-purpose memory area. The event memory area is an area for recording event information, and the general-purpose memory area is an area for recording data used by a user.

The setting register 50 stores recording digit setting data, an event detection cycle, and clocking information output instruction data. The event detection cycle sets an interval at which the control circuit 40b checks whether or not the event detection circuit 40a has detected the occurrence of an event. That is, the control circuit 40b checks the presence or absence of an event at the event detection cycle, and when the event occurrence flag is on, the control circuit 40b records the event information in the memory 60.

The clocking information output instruction data is information indicating the presence or absence of an instruction for outputting the clocking information. The clocking section 20b refers to the clocking information output instruction data at a predetermined cycle, and when the output of the clocking information is instructed, the clocking section 20b writes the clocking information to the memory 60. A writing address of the clocking information may be predetermined or may be able to be specified.

When recording the time in the memory 60, the recording digit setting data is data for setting necessary digits (recording digits) so that only the necessary digits of the year, month, day, day of the week, hour, minute, and second are recorded in the memory 60. For example, each digit of the recording digit setting data may be configured with 1 bit, and when "0" is set, "do not record" may be set, and when "1" is set, "record" may be set. Then, "record" or "do not record" may be set for each digit of the recording digit setting data of a total of 7 bits. As a more specific example, when only the hour and minute digits are recorded in the memory 60 as the recording digits from the time data of the year, month, day, day of the week, hour, minute, and second stored in the clocking circuit 20, the hour and minute digits may be set to "1" and the other digits may be set to "0". The time resolution is set by the control circuit 40b and the clocking section 20b referring to the data.

The input/output processing circuit 70 is coupled to the setting register 50 and the memory 60, and is also coupled to an external terminal SDATA and an external terminal SCLK of the real-time clock device 1. The input/output processing circuit 70 serves as an input/output interface, and operates in synchronization with a clock signal input from the external terminal SCLK. That is, the input/output processing circuit 70 can input data for rewriting the contents of the setting register 50 from the external terminal SDATA and output the data to the setting register 50.

Further, the input/output processing circuit 70 can output data such as event information recorded in the memory 60 to the outside of the external terminal SDATA. That is, in the present embodiment, the input/output processing circuit 70 can perform input/output of data according to the I²C standard. In the present embodiment, the input/output processing circuit 70 can control the digit of the clocking information clocked by the clocking circuit 20 by writing the recording digit setting data to the setting register 50 through I²C standard communication.

Further, the input/output processing circuit 70 controls the cycle at which the control circuit 40b refers to the event occurrence flag by writing the event detection cycle to the setting register 50 through I²C standard communication. When the event occurrence flag is on, the control circuit 40b stores the event information in the memory 60. Then, when the event information is recorded in the memory 60, the input/output processing circuit 70 causes the event information to be output from the external terminal SDATA through I²C standard communication.

Further, the input/output processing circuit 70 causes the clocking section 20b to output the clocking information by writing the clocking information output instruction data to the setting register 50 through I²C standard communication. When the clocking information is recorded in the memory 60, the input/output processing circuit 70 causes the clocking information to be output from the external terminal SDATA through I²C standard communication.

As described above, in the present embodiment, the external terminal SDATA and the external terminal SCLK can control the digits of the clocking information clocked by the clocking circuit 20, the output timing of the clocking information, and the like. Therefore, in the present embodiment, the external terminal SDATA and the external terminal SCLK are clocking signal terminals. The clocking signal terminal may be used at least for controlling the clocking circuit, and may be used for controlling the functional circuit 40. In the present embodiment, the external terminal SDATA and the external terminal SCLK are also used for controlling the functional circuit 40. On the other hand, the external terminal Tf, which is the functional signal terminal in the present embodiment, is not used for controlling the clocking circuit 20.

Figure 3:
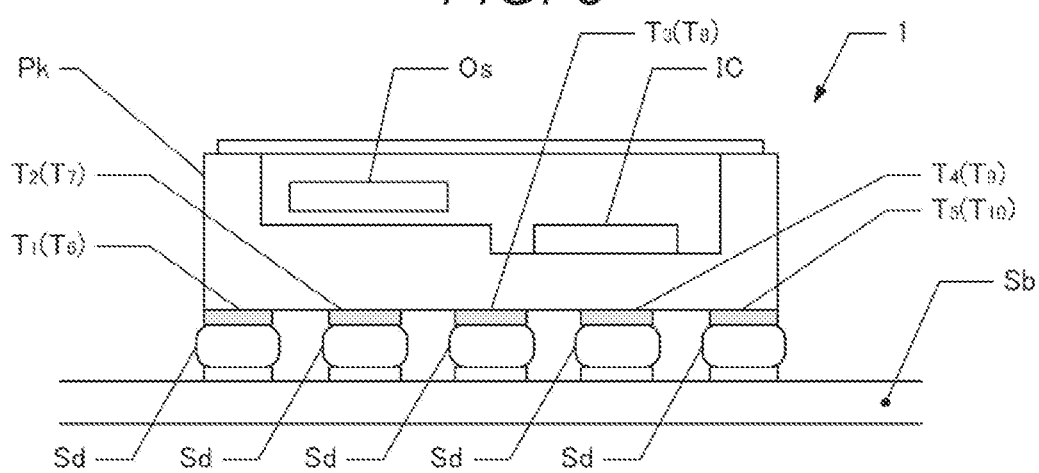
FIG. 3 is a diagram showing a state in which the real-time clock device according to the embodiment of the present disclosure is mounted on a substrate together with a schematic diagram of an internal structure.

The real-time clock device 1 according to the present embodiment as described above is mounted by soldering each external terminal to a pad on the substrate. FIG. 3 is a cross-sectional diagram showing a state in which the real-time clock device 1 is mounted on a substrate sb together with a schematic diagram of the internal structure. The package Pk houses the resonator Os and the IC. A portion of the resonator Os is fixed to the package Pk, and the other portion is in a floating state as shown in FIG. 3. Further, the IC is mounted in a recess in the package Pk, and is electrically coupled to a wiring in the package Pk via, for example, a bonding wire. The external terminals $T_1$ to $T_{10}$ are provided on the back surface of the package Pk. The external terminals $T_1$ to $T_{10}$ are electrically and mechanically coupled to terminals provided on the substrate Sb by a solder Sd, respectively.

The real-time clock device 1 is used for recording clocking information in the memory 60 and for outputting the clocking information via the external terminal SDATA. Further, the real-time clock device 1 is coupled to the substrate and is used for recording, in the memory 60, event information indicating the occurrence time of an event generated in an external device coupled to the external terminal Tf, and for outputting the event information via the external terminal SDATA.

In the present embodiment, in the real-time clock device 1 as described above, the coupling destination is selected according to the physical arrangement of the external terminals. That is, the functional signal terminal used for controlling the functional circuit 40 and not used for controlling the clocking circuit 20 is configured to be located outside the clocking signal terminal, the high-potential power supply terminal Vdd, and the low-potential power supply terminal GND.

Specifically, the external terminal Tf, which is a functional signal terminal, is any of the external terminals $T_1$, $T_5$, $T_6$, and $T_{10}$ located at the four corners of the external terminals Ti to $T_{10}$. The high-potential power supply terminal Vdd and the low-potential power supply terminal GND, and the external terminal SDATA and the external terminal SCLK, which are clocking signal terminals, are any of the external terminals $T_2$, $T_3$, $T_4$, $T_7$, $T_8$, and $T_9$.

In the present embodiment, the real-time clock device 1 is mounted on the substrate by soldering each of the external terminals $T_1$ to $T_{10}$ to the substrate. In this state, for example, when the ambient temperature changes, stresses of different magnitudes act on the external terminals due to a difference in the coefficient of thermal expansion between the package Pk and the substrate. As shown in FIG. 2, when a plurality of external terminals are arranged along the rectangular sides forming the back surface of the package Pk, the stress increases as the external terminals are located on the outside.

That is, the farther from the center of gravity of the real-time clock device 1 is, the larger the displacement due to thermal expansion is, so that a large stress is applied to the external terminal.

Therefore, the solder bonded to the external terminal located on the outside is more likely to crack than the solder bonded to the external terminal located on the inside. When cracks occur, a coupling failure may occur. Therefore, in the present embodiment, the clocking signal terminal for controlling the clocking circuit 20 that realizes the clocking function which is the basic function of the real-time clock device 1, the high-potential power supply terminal Vdd, and the low-potential power supply terminal GND are arranged inside. Further, the functional signal terminals used for controlling the functional circuit 40 that utilizes the clocking function of the real-time clock device 1 and not used for controlling the clocking circuit 20 are arranged at the four outer corners.

According to the above configuration, even if a crack occurs in the solder that bonds the external terminal and the substrate and a coupling failure occurs, the possibility that the function of the clocking circuit 20 becomes unavailable can be made lower than the possibility that the function of the functional circuit 40 becomes unavailable. Therefore, it is possible to increase the possibility that the basic functions of the real-time clock device 1 can be used even after a stress enough to cause cracks acts on the solder. That is, it is possible to reduce the possibility that the real-time clock device 1 cannot perform the required functions.

Note that, the functional signal terminals only need to be outside the high-potential power supply terminal Vdd, the low-potential power supply terminal GND, the external terminal SDATA, and the external terminal SCLK. Therefore, the external terminals serving as functional signal terminals are not limited to the configurations of the external terminals located at the four corners. For example, when the high-potential power supply terminal Vdd, the low-potential power supply terminal GND, the external terminal SDATA, and the external terminal SCLK are the external terminals $T_2$, $T_3$, $T_7$, and $T_8$, the functional signal terminals may be the external terminals $T_1$, $T_4$, $T_6$, and $T_9$.

(2) Other Embodiments

Figure 4:
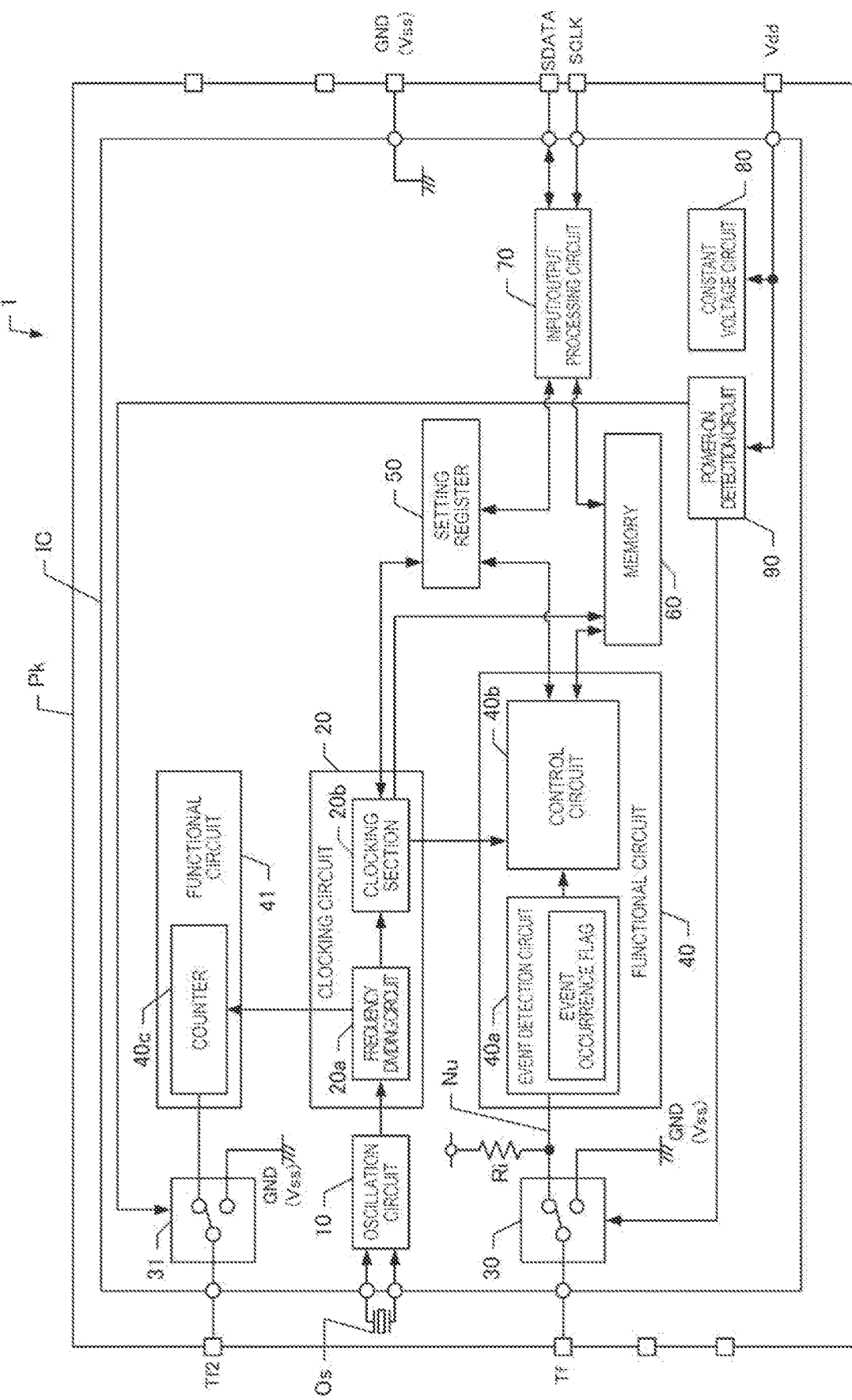
FIG. 4 is a configuration diagram of a real-time clock device according to an embodiment of the present disclosure.

The above-described embodiment is an example for carrying out the present disclosure, and various other embodiments can be employed. For example, the functional circuit 40 is not limited to a circuit that functions as an event recorder. Further, the functional circuit 40 may be able to execute a plurality of functions. FIG. 4 is a diagram showing a configuration of the real-time clock device 1 in which a circuit for realizing an interrupt output function is added to the configuration shown in FIG. 1 described above. The interrupt output function is a function of outputting an interrupt signal to an external terminal of the real-time clock device 1 at a predetermined timing.

In the configuration shown in FIG. 4, a functional circuit 41 and a switching circuit 31 are added to the configuration shown in FIG. 1. The functional circuit 41 includes a counter 40c. The counter 40c counts a1 [Hz] signal output by the frequency dividing circuit 20a, and when a preset period elapses, the counter 40c outputs an interrupt signal indicating the lapse of the period.

The switching circuit 31 is coupled to an external terminal Tf2 shown in FIG. 4, and can switch a coupling destination of the external terminal Tf2. In the present embodiment, either the counter 40c or the ground node is the coupling destination. The switching circuit 31 is controlled by the power-on detection circuit 90. That is, when a signal indicating that the power has been turned on is output from the power-on detection circuit 90, the switching circuit 31 couples the external terminal Tf2 to the counter 40c.

In this case, the interrupt signal output from the counter 40c is output to the external terminal Tf2. Therefore, the other devices coupled to the external terminal Tf2 of the real-time clock device 1 can specify that a preset period has elapsed from the start of counting based on the signal output from the external terminal Tf2. In the present embodiment, the external terminal Tf2 is an output terminal of the interrupt signal output from the functional circuit 41 and is used for controlling the functional circuit 41, but is not used for controlling the clocking circuit 20. Therefore, the external terminal Tf2 is a functional signal terminal.

In the real-time clock device 1 shown in FIG. 4, the external terminal Tf and the external terminal Tf2 coupled to the functional circuit 40 and the functional circuit 41 and used for controlling these functional circuits are terminals arranged outside. For example, a configuration is employed in which the external terminal Tf and the external terminal Tf2, which are functional signal terminals, are any of the external terminals $T_1$, $T_5$, $T_6$, and $T_{10}$. In this case, the high-potential power supply terminal Vdd and the low-potential power supply terminal GND, and the external terminal SDATA and the external terminal SCLK, which are clocking signal terminals, are any of the external terminals $T_2$, $T_3$, $T_4$, $T_7$, $T_8$, and $T_9$.

According to the above configuration, it is possible to increase the possibility that the basic functions of the real-time clock device 1 can be used even after a stress enough to cause cracks acts on the solder. That is, it is possible to reduce the possibility that the real-time clock device 1 cannot perform the required functions. The external terminal Tf and the external terminal Tf2 only need to be outside the high-potential power supply terminal Vdd and the low-potential power supply terminal GND, and the external terminal SDATA and the external terminal SCLK, which are the clocking signal terminals, and may be selected from locations other than the four corners.

Further, the switching circuit may be able to switch between a state in which the functional signal terminal and the functional circuit are coupled and a state in which the functional signal terminal and the functional circuit are not coupled. The timing at which the switching is performed is not limited to the timing after a predetermined period has elapsed from the start of power supply as in the above-described embodiment.

For example, whether or not the function of the functional circuit 40 is available may be able to be set from the outside of the real-time clock device 1. As a configuration for this purpose, for example, in the configurations shown in FIGS. 1 and 4, the memory 60 may be configured with a non-volatile memory, and switching may be performed based on storage information stored in the memory 60.

That is, the input/output processing circuit 70 can store switching information indicating whether or not to use the functional circuit in a predetermined address of the memory 60 based on a signal from an external device. When the switching information indicates the use of the functional circuit, the switching circuits 30 and 31 switch the switch so that the external terminals Tf and Tf2, which are the functional signal terminals, and the functional circuits 40 and 41 are coupled. On the other hand, when the switching information does not indicate the use of the functional circuit, the switching circuits 30 and 31 switch the switch so that the external terminals Tf and Tf2, which are the functional signal terminals, and the functional circuits 40 and 41 are not coupled.

According to the above configuration, the functional circuits 40 and 41 can be made available or unavailable according to an instruction from a device or a user capable of recording switching information in the memory 60 through I$^2$C standard communication. Therefore, for example, the user can switch whether or not to use the functional circuits 40 and 41 according to the specifications of the functions required by the user. Further, a manufacturer of the real-time clock device 1 can switch whether or not to use the functional circuits 40 and 41 before shipping according to the specifications of the functions required by a user at a shipping destination. When the specifications do not use the functions of the functional circuits 40 and 41, by stopping the functions, it is possible to prevent an adverse effect on the circuit due to cracks even if the cracks occur in the solder corresponding to the external terminals Tf and Tf2.

Further, in the configuration in which the functional circuit is unavailable for a period from the start of power supply to the high-potential power supply terminal to the occurrence of a predetermined trigger, the trigger is not limited to the lapse of a predetermined period. For example, in the configurations shown in FIGS. 1 and 4 and the like, a predetermined command for executing switching in the switching circuits 30 and 31 may be prepared, and switching may be performed when the command is input to the real-time clock device 1.

Specifically, for example, when a predetermined command is input to the input/output processing circuit 70 by the external terminal SDATA and the external terminal SCLK, which are clocking signal terminals, the input/output processing circuit 70 is configured to output a signal instructing the switching circuits 30 and 31 to perform switching. In the switching circuits 30 and 31, the state in which the functional signal terminal and the functional circuit are not coupled is switched to the state in which the functional signal terminal and the functional circuit are coupled in response to the signal instructing the switching.

According to the above configuration, the functional circuits 40 and 41 can be made available or unavailable by the user inputting a predetermined command to the real-time clock device 1 through I$^2$C standard communication. Therefore, for example, the functional circuits 40 and 41 are not used at the time when the power supply to the real-time clock device 1 is started, but the functional circuits 40 and 41 can be used after the user inputs a predetermined command.

Therefore, immediately after the power is turned on, which makes the operation of the real-time clock device 1 and various electronic devices coupled to the substrate unstable, it is possible to prevent an unexpected signal from being input from the external terminals Tf and Tf2 to the functional circuit 40. Further, it is possible to prevent an unexpected signal from being output from the functional circuit 40 to the external terminals Tf and Tf2.

The clocking circuit may be a circuit that generates clocking information, and the functional circuit may be a circuit that performs information processing based on the clocking information. That is, in the real-time clock device, at least the clocking information can be generated. The clocking information can be used for various purposes by using the clocking signal terminal. On the other hand, the real-time clock device is provided with a functional circuit used for purposes other than the generation of the clocking information. That is, the functional circuit may be able to perform information processing based on the clocking information. The information processing is not limited to information processing for the event recorder as in the above-described embodiment and for interrupt output, and may be any other information processing.

The package may house an resonator, an oscillation circuit, a clocking circuit, and a functional circuit, and external terminals may be formed thereon. Of course, other circuits, elements, and the like may be housed. The external terminal may be used for exchanging signals inside and outside the package, exchanging electric power, and the like, and may be formed for any purpose.

The external terminal includes a high-potential power supply terminal, a low-potential power supply terminal, a clocking signal terminal, and a functional signal terminal. The clocking signal terminal may be used at least for controlling the clocking circuit, and may be used for controlling the functional circuit. For example, the above-mentioned SPI standard terminal and I$^2$C standard terminal correspond to a clocking signal terminal used for purposes other than controlling the clocking circuit.

The clocking signal terminal may be used at least for controlling the clocking circuit, may be at least one terminal of input and output of various signals, and may be a terminal for various control and synchronization such as an enable signal and a clock signal.

The functional signal terminal is a terminal used for controlling the functional circuit. For example, a terminal used for controlling the functional circuit but not directly used for controlling the clocking circuit corresponds to the functional signal terminal. That is, the terminal required for controlling the clocking circuit is not a functional signal terminal but a clocking signal terminal.

The functional signal terminal may be arranged outside the high-potential power supply terminal, the low-potential power supply terminal, and the clocking signal terminal in a direction in which the external terminals are arranged. That is, when the functional signal terminal is compared with the high-potential power supply terminal, the low-potential power supply terminal, and the clocking signal terminal, the functional signal terminal is always arranged outside the other terminals. Whether the external terminals are located on the outside or the inside can be defined by considering that the end side of the arranged external terminals is the outside in the state in which the terminals are arranged along the side of the package. That is, there are no high-potential power supply terminal, low-potential power supply terminal, or clocking signal terminal outside any functional signal terminal. Further, the outside may be defined as being relatively far from the center of gravity of the package in plan view. The center of gravity may be an intersection of diagonal lines of a rectangle, for example, when the shape of the back surface of the package is considered to be the rectangle circumscribing the back surface. The plan view is, for example, a state in which the external terminal is viewed from a direction perpendicular to the bottom surface of the real-time clock device 1, as shown in FIG. 2.

The switching circuit may be able to switch between a state in which the functional signal terminal and the functional circuit are coupled and a state in which the functional signal terminal and the functional circuit are not coupled. That is, the switching circuit may be able to switch between a state in which the functional circuit is available and a state in which the functional circuit is unavailable. When the package is mounted on the substrate by soldering, each of the external terminals is coupled to a pad or the like on the substrate by soldering. When a force acts on the substrate and a twist or the like occurs on the substrate, a force acts on the solder of each external terminal. Comparing the stress acting on each external terminal in a state in which the external terminals are arranged in a straight line, the stress acting on the terminal on the outer side (closer to the end) is larger than that acting on the terminal on the inner side.

Therefore, the external terminals present on the outside are more likely to crack than the external terminals present on the inside. Therefore, the functional signal terminals arranged on the outside are more likely to have a coupling failure due to solder cracks than other terminals. Then, even if a coupling failure occurs, the functional circuit can be made not used by switching the switching circuit.

What is claimed is:

1. A real-time clock device comprising:
   a resonator;
   an oscillation circuit that oscillates the resonator;
   a clocking circuit that performs clocking based on a signal from the oscillation circuit and generates clocking information;
   a functional circuit that performs information processing based on the clocking information;
   a package that houses the resonator, the oscillation circuit, the clocking circuit, and the functional circuit, the package being substantially quadrangular-prism-shaped, the package having a bottom outer surface having a first side, a second side, a third side, and a fourth side, the first and second sides extending in a first direction, the third and fourth sides extending in a second direction perpendicular to the first direction, the first, second, third and fourth sides defining four corners of the bottom outer surface;
   external terminals that are formed on the bottom outer surface of the package, five terminals of the external terminals being arranged side by side along each of the first side and the second side, the external terminals including an outer terminal group and an inner terminal group, the outer terminal group being arranged along each of the third and fourth sides or either of the third side or the fourth side, the inner terminal group being away from each of the third and fourth sides, wherein the inner terminal group includes:
      a high-potential power supply terminal coupled to a high-potential power supply;
      a low-potential power supply terminal coupled to a low-potential power supply; and
      a clocking signal terminal used at least for controlling the clocking circuit; and
   the outer terminal group includes a functional signal terminal used for controlling the functional circuit; and
   a switching circuit selectively electrically coupling the functional terminals to the functional circuit, wherein
   the functional signal terminal is located at a first corner of the four corners of the bottom outer surface of the package, and the first corner has a configuration in which a tip of the first corner is cut off such that the first corner is configured with three lines,
   edges of the functional signal terminal align with the cut-off tip of the first corner and the first and third sides of the bottom outer surface of the package,
   a first width in the first direction of each terminal of the outer terminal group is larger than a second width in the first direction of each terminal of the inner terminal group, and
   a terminal of the inner terminal group has a notch at a position on either of the first side or the second side of the bottom outer surface of the package.

2. The real-time clock device according to claim 1, wherein the functional circuit is a circuit that stores the clocking information in a memory when a voltage level of a signal input to the functional signal terminal changes.

3. The real-time clock device according to claim 1, wherein the functional circuit is a circuit that outputs an interrupt signal to the functional signal terminal at a timing based on the clocking information.

4. The real-time clock device according to claim 1, further comprising a non-volatile memory,
   wherein the switching circuit switches between a first state in which the functional signal terminal and the functional circuit are coupled and a second state in which the functional signal terminal and the functional circuit are not coupled, based on switching information stored in the non-volatile memory.

5. The real-time clock device according to claim 1, wherein the switching circuit switches to;
   the second state during a period of a predetermined time from a start of power supply to the high-potential power supply terminal; and
   the first state after a lapse of the predetermined time.

6. The real-time clock device according to claim 1, wherein the switching circuit switches to:
   the second state during a period from a start of power supply to the high-potential power supply terminal to an input of a predetermined command signal to the clocking signal terminal; and
   the first state after the predetermined command signal is input.

* * * * *